United States Patent [19]
Allaert et al.

[11] Patent Number: 5,013,197
[45] Date of Patent: May 7, 1991

[54] LOCKING BOLT FOR EQUIPMENT SUPPORT

[75] Inventors: François Allaert, Pibrac; Pierre Faurie, Toulouse; Serge Roques, Blagnac; Sylvain Segol, Toulouse, all of France

[73] Assignee: Aerospatiale Societe Nationale Industrielle, Paris, France

[21] Appl. No.: 433,525

[22] Filed: Nov. 8, 1989

[30] Foreign Application Priority Data

Nov. 10, 1988 [FR] France .................. 88 14691

[51] Int. Cl.⁵ .................................. F16B 31/02
[52] U.S. Cl. ........................ 410/77; 411/432; 411/533; 292/256.75; 403/12
[58] Field of Search .............. 410/77, 86; 403/11, 403/12, 104; 411/150, 427, 432, 533, 191, 331, 327, 147, 326; 292/256.73, 256.75

[56] References Cited

U.S. PATENT DOCUMENTS

| | | | |
|---|---|---|---|
| 2,798,635 | 7/1957 | Elkind | 220/325 |
| 3,212,746 | 10/1965 | Wright | 410/77 |
| 3,282,316 | 11/1966 | Griswold | 411/326 |
| 3,480,248 | 11/1969 | Lucchino et al. | 410/77 X |
| 3,670,795 | 6/1972 | Kupfrain | 411/191 X |
| 3,866,878 | 2/1975 | Yamamoto | 411/330 |
| 4,530,530 | 7/1985 | Schaefer | 411/427 X |
| 4,830,530 | 5/1989 | Meineke | 292/256.75 X |

FOREIGN PATENT DOCUMENTS

| | | | |
|---|---|---|---|
| 2056324 | 7/1971 | Fed. Rep. of Germany | 411/191 |
| 0306293 | 6/1971 | U.S.S.R. | 411/191 |

Primary Examiner—Robert J. Spar
Assistant Examiner—James T. Eller, Jr.
Attorney, Agent, or Firm—Pearne, Gordon, McCoy & Granger

[57] ABSTRACT

In order to fix an equipment (12) to a support (10), such as a support onboard an aircraft, use is made of a locking bolt (16) having a threaded rod (24) articulated by a yoke (18) to support (10) and on which is screwed a manipulating nut (26). A bearing part (28), immobilized in rotation on threaded rod (24), is connected with a certain axial clearance to nut (26) and has on its front face a cup-shaped recess (34) able to cover a lug (14) fixed to the equipment (12). Springs (38) placed in slots (39) of nut (26) permanently apply rods (40) to the rear face of part (28) on which are formed indentations (42).

6 Claims, 1 Drawing Sheet

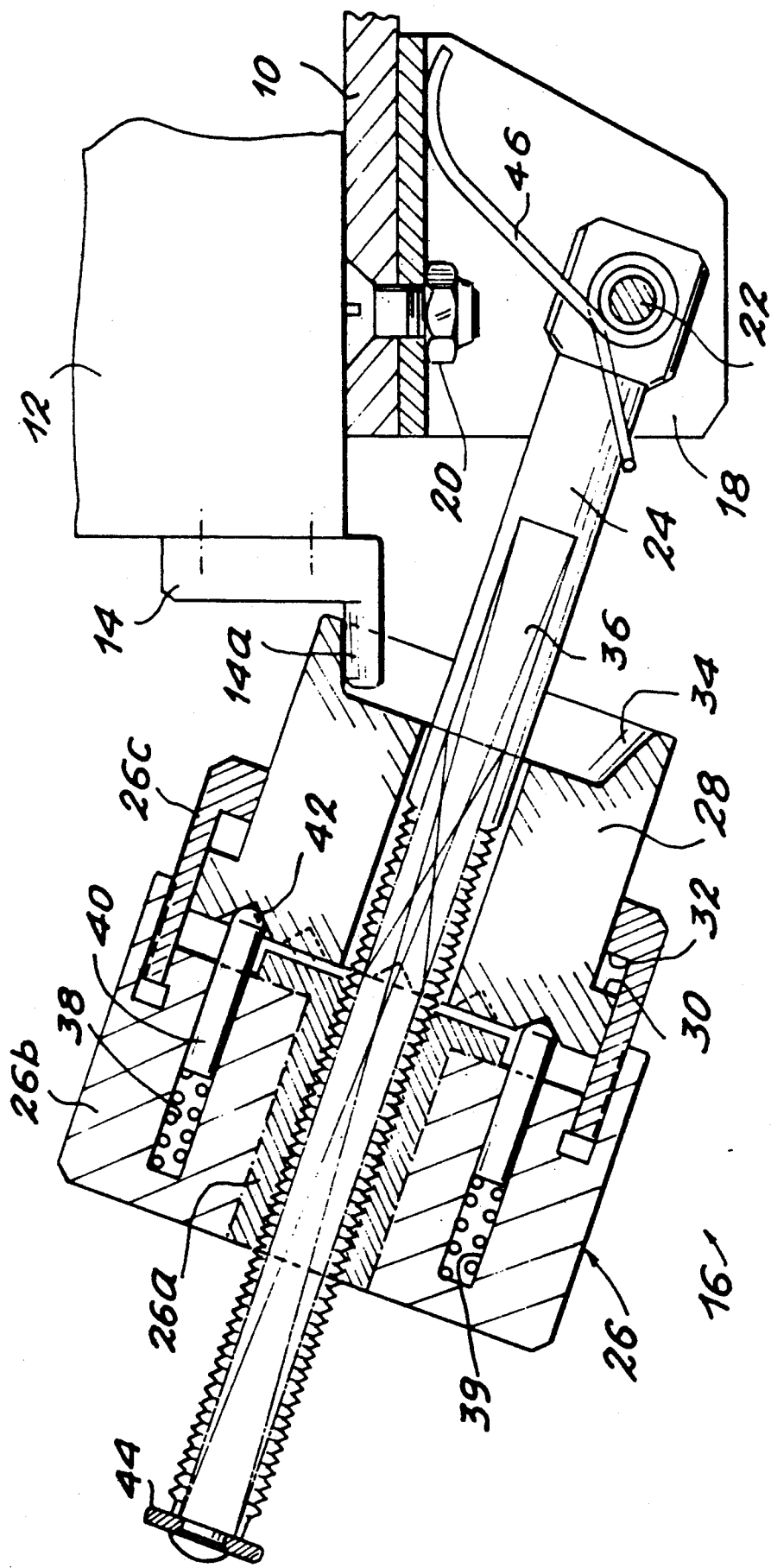

LOCKING BOLT FOR EQUIPMENT SUPPORT

BACKGROUND OF THE INVENTION

The invention relates to a locking bolt to be mounted on a support for receiving equipment, e.g. of an electrical or electromechanical nature, more particularly on an aircraft.

Such a locking bolt must permit easy fitting and dismantling of equipment with respect to the support thereof, as well as the plugging in of connectors of the equipment and its support in the case of electrical equipment, particularly when the insertion forces are high. Finally, the bolt must keep the equipment firmly and reliably on the support, even when it is subject to severe mechanical stresses (vibrations, accelerations, shocks), in order to ensure a perfect connection of the electrical equipment.

U.S. Pat. No. 3,212,746 describes a locking bolt incorporating a threaded rod, whereof one end is articulated to the equipment support and to which is screwed a manipulating nut, whose front face is given a cup-shaped configuration and covers a lug fixed to the equipment. This simply designed bolt complies with the above requirements in a satisfactory manner.

Moreover, the bolt described in U.S. Pat. No. 3,212,746 comprises an anti-slackening or release device mainly constituted by a sliding latch carried by the nut and which can be moved between two stable positions, one of which prevents any rotation of the nut on the threaded rod. This anti-rotation device suffers from the disadvantage of requiring action on the part of the operator. When the latter forgets to operate the latch, the anti-slackening device consequently has no effect.

Moreover, the locking bolt described in U.S. Pat. 3,212,746 suffers from the major disadvantage that in the case of an inadequate tightening of the bolt, the equipment may move on its support to a sufficient extent for the lug fixed to the equipment to escape from the cup-shaped slot formed on the front face of the nut.

U.S. Pat. No. 3,282,316 also describes a locking bolt having a threaded rod, whereof one end bears in pivotal manner on an equipment support and a manipulating nut screwed to said threaded rod. The screwing of the manipulating nut to the threaded rod makes it possible to apply a T-shaped part to a lug connected to the equipment. At the end of tightening, balls mounted in said part are applied by springs into openings formed in the manipulating nut, so as to prevent the latter from rotating under the effect of vibrations.

Although the locking bolt described in U.S. Pat. No. 3,282,316 requires no particular action on the part of the operator to prevent accidental loosening or release, like the previously described bolt, it suffers from the disadvantage of not preventing a displacement of the equipment on its support in the case of a poor tightening of the bolt.

The present invention relates to a simply designed, inexpensive locking bolt which prevents an accidental loosening or release without involving any action on the part of the operator and which prevents a displacement of the equipment on its support when the said bolt is inadequately tightened.

According to the invention this object is achieved by means of a locking bolt for an equipment support, incorporating a threaded rod, whereof one end can be articulated to the support, a manipulating nut screwed to said rod and a bearing part mounted on the threaded rod so that it can be applied to a member connected to equipment placed on the support during a rotation of the manipulating nut, characterized in that the bearing part has a predetermined travel with respect to the manipulating nut along the axis of the threaded rod, elastic means being placed between the manipulating nut and the bearing part in order to permanently urge the latter towards said end of the threaded rod in the direction of a front abutment formed on the nut, said elastic means also actuating anti-release means opposing with a predetermined force a relative rotation between the manipulating nut and the bearing part.

As a result of these characteristics, when the locking bolt is tightened, even to an inadequate extent, the bearing part moves away from the front abutment formed on the nut counter to the elastic means over a distance which is sufficiently large for said bearing part to remain in contact with the member linked with the equipment, even if the latter moves away from the nut. Moreover, the presence of anti-release means directly actuated by said elastic means makes it possible to avoid an accidental unscrewing of the nut, without any action being necessary on the part of the operator.

In order to prevent premature wear to the bearing part and the member facing one another and fixed to the equipment, said bearing part is mounted on the threaded rod in such a way as to be immobilized in rotation.

According to a preferred embodiment of the invention, the elastic means comprise at least two compression springs displaced with respect to the axis of the threaded rod and received in recesses formed in the manipulating nut, each spring applying an anti-release member to the rear face of the bearing part having at least two indentations which can be positioned facing said anti-release members.

Advantageously, as the end of the threaded rod is articulated by a spindle on a yoke which can be fixed to the support, a torsion spring is mounted on said spindle and bears on the yoke and on the threaded rod, in order to normally maintain the latter in a setting position inclined by, at the most, approximately 30° in the downward direction with respect to the horizontal.

BRIEF DESCRIPTION OF THE DRAWING

A preferred embodiment of the invention will now be described in non-limitative manner with reference to the attached drawing, which is a longitudinal sectional view of a locking bolt constructed according to the invention and shown in the position which it occupies when it ensures the fixing of an equipment to the support carrying said locking bolt.

DESCRIPTION OF THE PREFERRED EMBODIMENT

In the said drawing, reference 10 designates an equipment support, which is, for example, in the form of a horizontal shelf. In a preferred application of the invention, the support 10 is an equipment support, which is, for example, on board an aircraft.

Support 10 receives an equipment 12, such as an electrical or electromechanical equipment. In its not shown rear part, said equipment 12 has electrical connectors which are fitted to complementary electrical connectors of support 10. In conventional manner, the equipment 12 has, on its front face turned to the left when considering the drawing, at least one L-shaped lug 14, whereof one branch is fixed by any appropriate means to equipment 12 and whereof the other branch 14a projects forwards approximately in the extension of the support 10. Each of the lugs 14 of equipment 12 cooperates with a locking bolt 16 mounted on support 10 and constructed in accordance with the present invention.

The locking bolt 16 firstly comprises a yoke 18 fixed beneath the front end of the horizontal set of shelves forming the support 10 by any appropriate means, such as seated screws 20, whereof only one is shown in the drawing. The yoke 18 supports a horizontal spindle 22 oriented parallel to the front edge of the set of shelves forming support 10. Spindle 22 traverses one end of a threaded rod 24 to which is screwed a manipulating nut 26, in such a way that rod 24 can pivot about spindle 22.

In the ebodiment illustrated in the drawing, the manipulating nut is in three parts, which are joined together by any appropriate means, e.g. by force fitting. The first part 26a constitutes the actual nut, which has a taphole, so that it can be directly screwed onto the threaded rod 24. The second part 26b constitutes an annular control knob surrounding nut 26a and whose outer surface is shaped so as to permit a manual rotation of the nut. Finally, the third and also annular part 26c is integral with the front face of the control knob 26b, in order to constitute a front cover of the locking bolt, whose function will be described hereinafter.

In the represented embodiment, the multipart construction of the manipulating nut 26 is due to the fact that these three parts can be made from different materials, nut 26a being made, for example, from steel, whereas the control knob 26b and front cover 26c can be made from injected plastics material.

The nut 26 according to the invention also comprises a bearing part 28 with a generally annular configuration and which is mounted in rotary manner within the front cover 26c, so as to have given axial clearance with respect to the control knob 26 parallel to the axis of threaded rod 24. In practice, this travel is limited rearwards, i.e. towards the left of the drawing, by a planar rear face of part 28 bearing against a planar front face of nut 26a. The forward limitation of the travel of bearing part 28 is ensured by a shoulder 30 formed on the outer surface of said part bearing against a shoulder 32 formed on the inner surface of the front cover 26c. The fitting on the bearing part 28 in front cover 26c is permitted by the construction of the control knob 26b and the front cover 26c in the form of two different parts.

The bearing part 28, which is made from a hard material such as steel, projects forwards beyond the front cover 26c and has on its front face a cup-shaped recess 34 centered on the axis of the threaded rod 24. This recess 34 makes it possible to cover the branch 14a of lug 14 fixed to equipment 12 in the manner shown in the drawing.

Moreover, the bearing part 28 cooperates with the threaded rod 24 via means making it possible to prevent any rotation of the bearing part on the latter. In the embodiment shown in the drawing, said means are constituted by two diametrically opposite flats 36 formed on the threaded rod 24 and with which cooperate two corresponding flats formed in the bore of part 28 traversed by the threaded rod 24. Obviously, a comparable result could be obtained by different means such as a key mounted within the part 28 and cooperating with a keyway formed on the threaded rod 24.

As is shown in the drawing, the locking bolt 16 according to the invention also has helical compression springs 38 placed in cylindrical slots 39 issuing onto the front face of the control knob 26b, so as to bear in the bottom of the slots. The opposite end of each of the springs 38 bears on a cylindrical rod or pin 40 sliding in slots 39 formed in control knob 26b and whereof the hemispherical front end is urged to bear against the rear face of part 28 by springs 38. When part 28 does not bear on lug 14, the springs 38 have the effect of maintaining said part 28 in an extreme forward position in which shoulder 30 bears against shoulder 32.

Moreover, in view of the fact that the bearing part 28 is immobilized in rotation on threaded rod 24, the assembly formed by the springs 38 and the cylindrical rods 40 is used to oppose the rotation of the manipulating nut 26 outside any actuation on the latter and consequently oppose any accidental release of the bolt. To this end, conical indentations 42 are formed on the planar rear face of bearing part 28. More specifically, the number of indentations 42 is a multiple of the number of rods 40 and the locations of these indentations 42 are a function of the locations of the rods 40, in such a way that the convex front end of each of the rods 40 can be housed in each of the indentations 42.

The number of rods 40, and consequently indentations 42, is at least equal to two, the rods and indentations being distributed at regularly intervals around the axis of the bolt. Preferably, said number is equal to three for force balancing reasons.

Advantageously, the escape of the manipulating nut 26 is prevented by a rear abutment 44, such as a washer screwed or seated at the end of the threaded rod 24 opposite to spindle 22.

Finally, the locking bolt according to the invention preferably has a hairpin torsion spring 46 wound around the pivot pin 22 and whose ends respectively bear on the yoke 18 is fixed to support 10 and on the threaded rod 24. When the bolt is not actuated, spring 46 has the effect of maintaining the threaded rod 24 in a setting position in which said rod forms an angle of, at the most, approximately 30° downwards with respect to the horizontal. This setting or waiting position facilitates the fitting of the equipment and prevents any deterioration to the bolt or support in the case of any accidental bearing action on the part of the operator, particularly in a confined area.

The use of the aforementioned bolt 16 takes place in the following way. Before the operator places the equipment 12 on its support 10, bolt 16 occupies an almost horizontal position undr the effect of spring 46. The manipulating nut 26 is then unscrewed to the vicinity of abutment 44.

When the equipment 12 is placed on its support 10, the operator raises the spindle of the bolt again into the position illustrated in the drawing and manually screws down the manipulating nut 26, which has the effect of moving the cup-shaped recess 34 towards lug 14. As soon as the bearing part 28 covers lug 14, said part undergoes no further advance, whilst the manipulating nut 26 continues to move forwards under the effect of its screwing action.

Thus, springs 38 compress until the rest face of part 28 bears on the front face of nut 26a.

On continuing the screwing of the manipulating nut 26, the operator can then exert an adequate force of equipment 12 via part 28 for the connectors at the rear of said equipment to fit into the complementary connectors located on support 10. The fixing of the equipment 12 is then sufficiently stable and reliable to maintain said equipment in place and for the continuity of the electrical connection, even when the locking bolt is located in a severe mechanical environment (vibrations, accelerations, shocks, etc).

According to an essential feature of the invention, the springs 38 permanently exert an axial forward force on the bearing part 28 and the latter has a relatively long axial travel. Consequently, even in the case of an inadequate tightening of the bolt, it is always accompanied by a recoil of the bearing part 28 to its rear abutment position shown in the drawing, so that any recoil of equipment 12 is accompanied by an advance of part 28. Thus, the lug 14 remains attached in the cup-shaped recess 34 over a much greater distance than with the prior art devices.

Moreover, the rods 40 associated with the springs 38 fulfil an anti-release or loosening function of the bolt by being located in the indentations 42 of part 28. Thus, as the latter is immobilized in rotation on threaded rod 24, the manipulating nut 26 is also immobilized in rotation for as long as an adequate force is not manually exerted on the control knob 26b.

The invention is obviously not limited to the embodiments described hereinbefore and covers all variants thereof. Thus, the attachment system constituted by lug 14 and the cup-shaped recess 34 of part 28 could have a different form without passing beyond the scope of the invention. In the same way, the cylindrical rods 40 can be replaced by differently shaped members fulfilling the same function.

We claim:

1. Locking bolt for an equipment support, comprising:
   a threaded rod having one end which can be articulated to the support;
   a manipulating nut screwed to said rod and movable thereon;
   a front abutment on said nut;
   a bearing part freely mounted on said threaded rod between said articulated end and the manipulating nut so that said bearing part can be brought into engagement with a member fixed to equipment placed on the support, by rotation of said manipulating nut, so as to have a predetermined axial clearance with respect to the manipulating nut along the axis of the threaded rod;
   an elastic means being placed between said manipulating nut and said bearing part in order to permanently urge said bearing part towards said articulated end of the threaded rod in the direction of said front abutment formed on the nut, said elastic means also actuating anti-release means opposing with a predetermined force a relative rotation between the manipulating nut and the bearing part, said elastic means having at least two compression springs received in blind cylindrical slots formed in the manipulating nut, said slots opening towards a rear face of the bearing part and being offset with respect to the axis of said threaded rod; and
   an anti-release member being received in each slot between the spring and the rear face of said bearing part, said rear face having indentations sufficient in number to match the number of said anti-release members which can be positioned facing said anti-release members.

2. Locking bolt according to claim 1, wherein anti-rotation means are provided between the bearing part and the threaded rod.

3. Locking bolt according to claim 1, wherein the bearing part has a front face turned towards said articulated end of the threaded rod providing a cup-shaped recess able to cover said equipment member and which is in the form of a lug.

4. Locking bolt according to claim 1, wherein said end of the threaded rod is pivotally connected to a spindle carried by a yoke, which can be fixed to the support, a torsion spring being mounted on said spindle and bearing on the yoke and the threaded rod, in order to normally maintain the latter in a setting position, in which said bearing part faces said member in a position facilitating contact with said member.

5. Locking bolt according to claim 4, wherein the threaded rod forms an angle of at the most approximately 30° downwards with respect to the horizontal in its setting position.

6. Locking bolt according to claim 1, wherein the other end of the threaded rod carries a rear abutment preventing the escape of the manipulating nut.

* * * * *